United States Patent [19]
Ang

[11] Patent Number: 5,406,143
[45] Date of Patent: Apr. 11, 1995

[54] GTL TO CMOS LEVEL SIGNAL CONVERTER, METHOD AND APPARATUS

[75] Inventor: Michael A. Ang, Santa Clara, Calif.

[73] Assignee: Vertex Semiconductor Corporation, San Jose, Calif.

[21] Appl. No.: 172,023

[22] Filed: Dec. 21, 1993

[51] Int. Cl.$^6$ ........................................ H03K 19/096
[52] U.S. Cl. ........................................ 326/68; 326/98
[58] Field of Search ............... 307/443, 451, 452, 475, 307/530; 365/208

[56] References Cited

U.S. PATENT DOCUMENTS

| | | | |
|---|---|---|---|
| 5,023,488 | 6/1991 | Gunning | 307/475 |
| 5,228,106 | 7/1993 | Ang et al. | 365/208 |
| 5,311,083 | 5/1994 | Wanlass | 307/443 X |
| 5,323,360 | 6/1994 | Pelley, III | 365/230.03 X |
| 5,332,934 | 7/1994 | Hashimoto et al. | 307/451 X |
| 5,347,177 | 9/1994 | Lipp | 307/475 X |

Primary Examiner—David R. Hudspeth
Attorney, Agent, or Firm—Limbach & Limbach

[57] ABSTRACT

A GTL signal to CMOS level signal converter has a sense amplifier to receive the GTL signal and a clock signal and generate a first signal in response thereto. A buffer has a plurality of clocked stages for receiving the clock signal and the first signal and for generating the CMOS signal. A clock generates the clock and supplies the clock signal to the sense amplifier and the buffer.

22 Claims, 2 Drawing Sheets

GTL TO CMOS LEVEL SIGNAL CONVERTER, METHOD AND APPARATUS

TECHNICAL FIELD

The present invention relates to a method and an apparatus for converting a GTL signal to a CMOS level signal and more particularly to a self-timed synchronous circuit for converting a GTL signal to a CMOS level signal.

BACKGROUND OF THE INVENTION

Digital electrical signals, such as CMOS level signals, are well known in the art. Typically, in digital circuit applications, the signal ranges from zero volts (representing one state) to five volts (representing another state). Low voltage CMOS level signals range from zero volts to approximately 3.3 volts. CMOS level signals have found wide usage because CMOS circuit components have low power dissipation. However, CMOS level signals have been limited in the speed of their transmission.

In certain applications, TTL electrical signals, another well known standard, have been used. However, TTL signals have a limitation of operation of up to approximately 80 to 100 mHz. In addition, TTL signals, if they are not shielded, present Electro Magnetic Interference (EMI) problems.

Recently, another standard for an electrical signal called Gunning Transceiver Logical (GTL) has been proposed. In a GTL signal, the signal swings between 0.4 volts and 1.2 volts with a reference voltage centered about 0.8 volts. Thus, a GTL signal is a low voltage swing logic signal, i.e., a deviation of at most about 0.4 volts from the central or reference voltage of 0.8 volts is required to drive the state of the logic, which the GTL signal represents. At the receiver, a circuit that can detect a swing of approximate 50 mv in one direction can be used to convert the GTL signal into a CMOS level signal. The advantage of the GTL signal is that it is low power dissipation and can operate at a very fast frequency because its resistive termination provides a clean signalling environment while the low terminating voltage of 1.2 volts results in reduced voltage drops across the said resistive elements. Furthermore, since the swing is low, EMI can be contained.

In the prior art, the conversion of a GTL signal into a CMOS level signal has been accomplished by the use of a differential sense amplifier, which is well known in the art. See, for example, U.S. Pat. No. 5,228,106. A differential sense amplifier, however, is a linear circuit and it consumes static current. At the input stage of conversion of a GTL signal to a CMOS level signal, it is estimated that approximately 1.5 to 2.0 milliamps of current is consumed.

One prior art solution to the problem of current consumption is to decrease the current to the differential sense amplifier. However, this affects the gain or the bandwidth and it reduces the speed of the converter. Further, the incoming signal is often times latched/registered immediately after conversion, incurring register set up time and clock to Q delays. A fully integrated solution consolidates these delays and minimizes them overall.

SUMMARY OF THE INVENTION

In the present invention, a GTL signal to CMOS level signal converter has a sense amplifier means to receive the GTL signal and a clock signal and generates a first signal in response thereto. A buffer means has a plurality of clocked stages. The buffer means receives the clock signal and the first signal and generates the CMOS level signal. A clock signal generator supplies the clock signals to the sense amplifier means and to the buffer means.

DETAILED DESCRIPTION OF THE DRAWINGS

Figure 1:
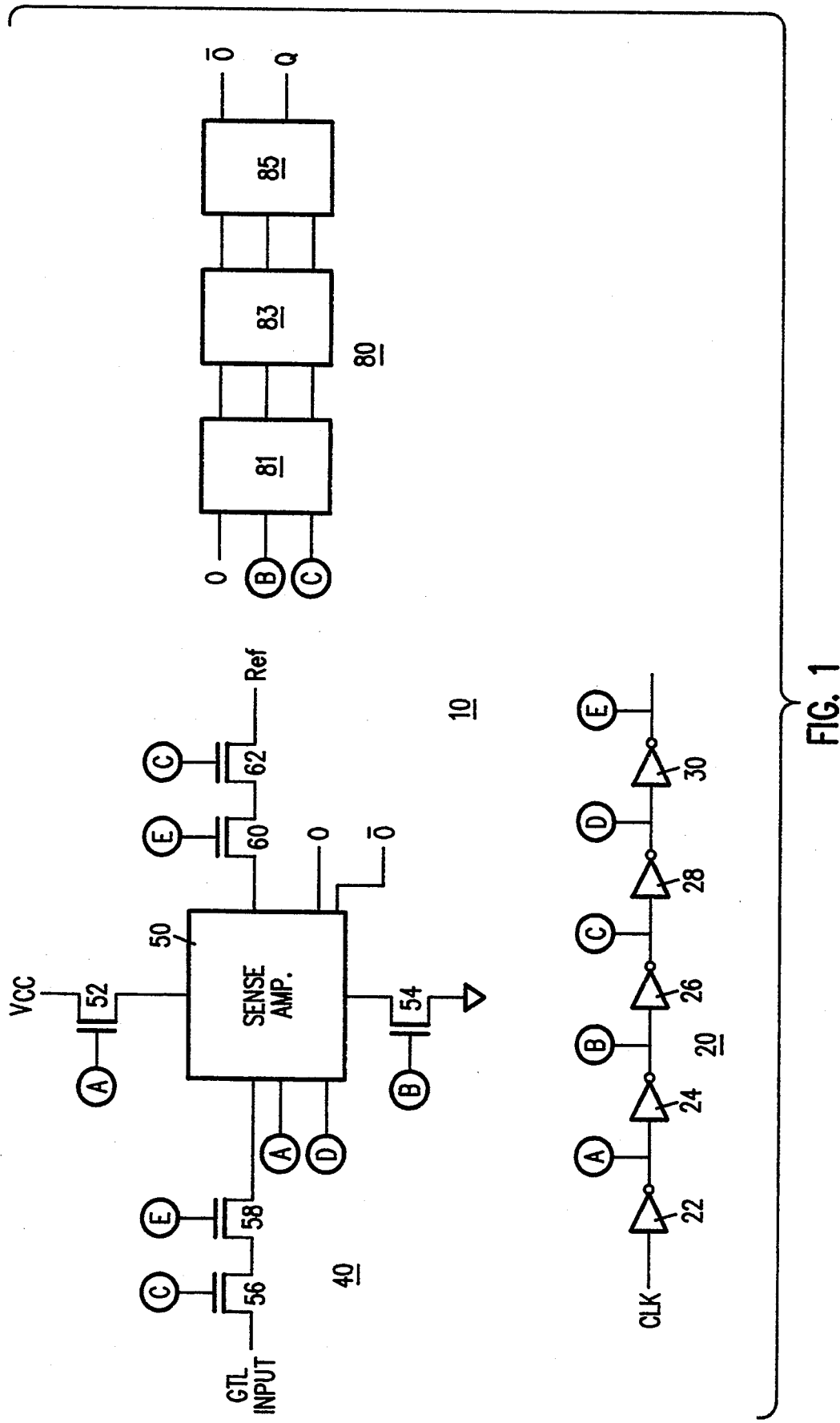
FIG. 1 is a block level diagram of the conversion circuit of the present invention showing three components in block diagram form.

Referring to FIG. 1 there is shown a conversion circuit 10 of the present invention. The conversion circuit 10 comprises a clock generator, labeled 20, a sense amplifying means, label 40 and a buffer means, labeled 80.

The clock generating means 20 comprises a plurality of substantially similar, serially connected invertors 22, 24, 26, 28 and 30. A clock signal CLK is supplied as the input to the first invertor 22. From the output of the first invertor 22, the clock signal A is generated and is also supplied as the input to the second invertor 24. From the output of the second invertor 24, the clock signal B is generated and supplied as the input to the third invertor 26. From the output of the third invertor 26, the clock signal C is generated and is supplied as the input to the fourth invertor 28. From the output of the fourth invertor 28, the clock signal D is generated and is supplied as the input to the fifth invertor 30. From the output of the fifth 30, the clock signal E is generated.

The sense amplifying means 40 comprises a differential sense amplifier 50. The differential sense amplifier 50 is connected serially through a PMOS transistor 52 to a source of voltage $V_{cc}$. The PMOS transistor 52, as is well known has a source, a gate, and a drain. The source and drain are connected to the sense amplifier 50 and to the source of voltage $V_{cc}$. AS is well known, the term source and drain may be used interchangeably. The gate is connect to receive the clock signal A, which controls the supply of the voltage $V_{cc}$ to the sense amplifier 50.

The differential sense amplifier 50 is also connected serially through an NMOS transistor 54 to a ground potential. The NMOS transistor 54 is controlled by the clock signal B at its gate. The differential sense amplifier 50 also receives the input GTL signal which is passed through two serially connected NMOS transistors 56 and 58. The NMOS transistors 56 and 58 are controlled by the clock signals C and E, respectively. The differential sense amplifier 50 is also connected, through two serially connected NMOS pass transistor 60 and 62 to a source of reference voltage (0.8 volts). The NMOS pass transistors 60 and 62 have their gates connected to receive the clock signals E and C, respectively.

Finally, the differential sense amplifier 50 receives the clock signals A and D and generates the output signals O and its complement $\overline{O}$. At this stage, the output signals O and $\overline{O}$ are signals in CMOS level signal convention.

The output signals O and $\overline{O}$ are supplied to the buffer means 80. In addition, the clock signal B and C are also supplied to the buffer means 80. The buffer means 80 comprises a first clocked stage 81, an inverter stage 83 and a clocked feedback stage 85. The output of the clocked feedback stage 85 provides the output signal Q from the conversion circuit 10 of the present invention.

Figure 2:
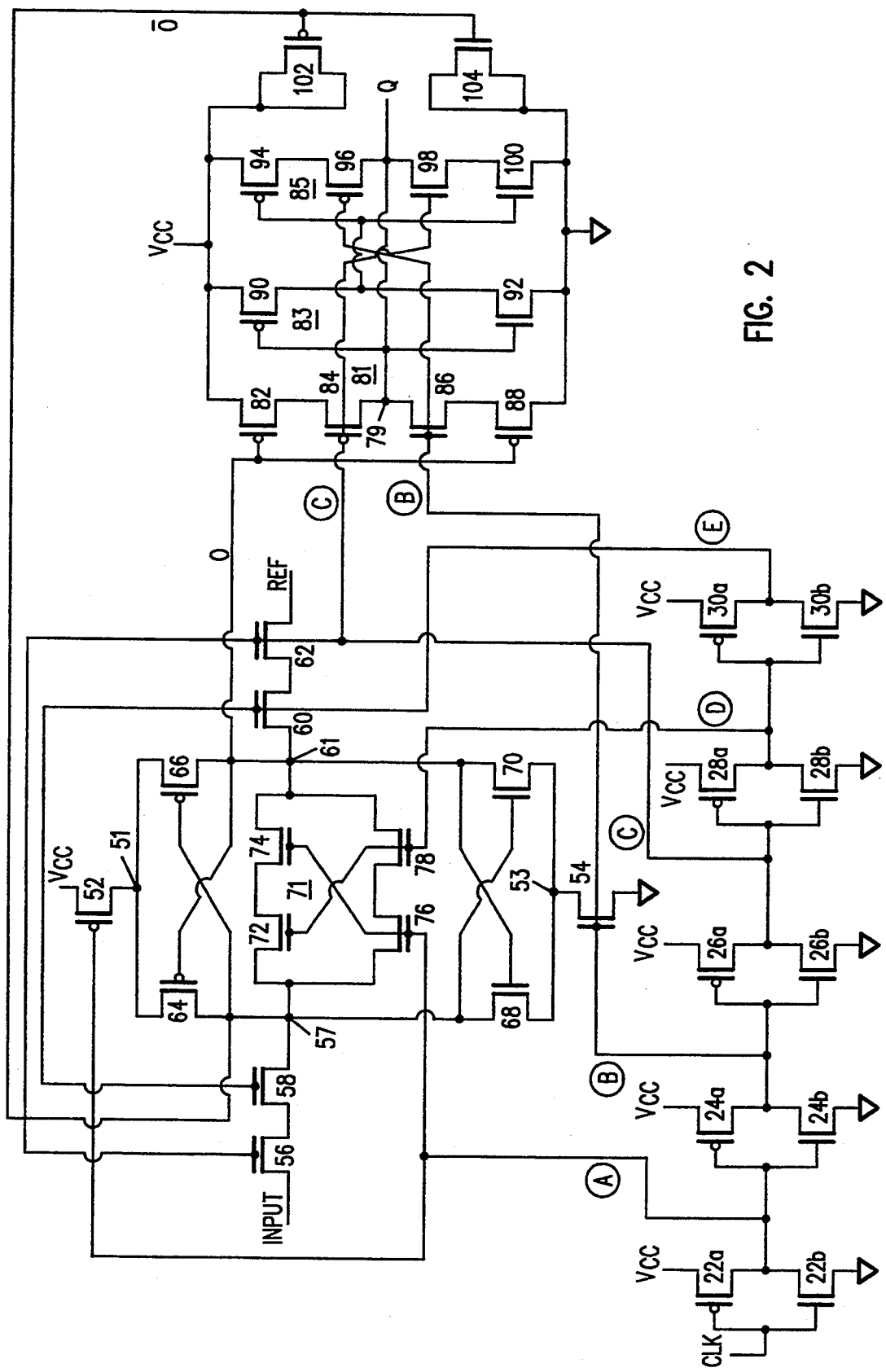
FIG. 2 is a detailed circuit diagram of the conversion circuit of the present invention, as shown in FIG. 1.

Referring to FIG. 2, there is shown in greater detail the conversion circuit 10 of the present invention. As previously discussed, the clock generating means 20 portion of the conversion circuit 10 comprises a plurality of substantially similar, serially connected invertors 22, 24, 26, 28 and 30. Each of the invertors is a well known CMOS invertor circuit comprising a PMOS type transistor and an NMOS type transistor. Thus, for example, the first invertor 22 comprises a PMOS transistor 22A and an NMOS transistor 22B. The gates of the PMOS transistor 22A and the NMOS transistor 22B are connected together to form the input which receives the clock signal CLK. The output of the first invertor 22 is supplied from the commonly connected source of the PMOS transistor 22A and the drain of the NMOS transistor 22B. The drain of the PMOS transistor 22A is connected to a source of power $V_{cc}$ while the source of the NMOS transistor 22B is connected to ground.

The sense amplifier 50 comprises two cross couple PMOS transistors 64 and 66 and two cross coupled NMOS transistors 68 and 70. The cross coupled PMOS transistors 64 and 66 and the cross coupled NMOS transistors 68 and 70 are connected in a well-known manner to form the sense amplifier 50. The common source to the PMOS transistors 64 and 66 are connected together and are connected to the drain of the PMOS transistor 52, at node 51. The source of the PMOS transistor 52 is connected to a source of power $V_{cc}$. As previously discussed, the gate of the PMOS transistor 52 is supplied with the clock signal A.

The gates of the PMOS transistors 64 and 66 are cross coupled in that the gate of the PMOS transistor 66 is electrically connected to the drain of the PMOS transistor 64, at node 57, while the gate of the PMOS transistor 64 is electrically connected to the drain of the PMOS transistor 66, at node 61. The drains of the PMOS transistors 64 and 66, at nodes 57 and 61, respectively, are connected to the drains of the NMOS transistor 68 and 70, respectively. In addition, the NMOS transistor 68 and 70 are cross coupled. Thus, the drain of the NMOS transistor 70, at node 61, is connected to the gate of the NMOS transistor 68 and the drain of the NMOS transistor 68, at node 57, is connected to the gate of the NMOS transistor 70. The common source of the NMOS transistors 68 and 70 are connected to the drain of the NMOS transistor 54, at node 53. The source of the NMOS transistor 54 is connected to ground. In addition, as previously discussed, the gate of the NMOS transistor 54 receives the clock signal B.

In addition, the sense amplifier 54 comprises an equalizer section 71. The equalizer section 71 comprises the NMOS transistors 72, 74, 76 and 78. The NMOS transistor 72, 74, 76 and 78 are cross coupled. The gate of the NMOS transistor 72 is connected to the gate of the NMOS transistor 78. The gate of the NMOS transistor 74 is connected to the gate of the NMOS transistor 76. The sources of the NMOS transistors 76 and 78 are connected together. The sources of the NMOS transistor 72 and 74 are connected together. The drains of the NMOS transistors 72 and 76 are connected together and to the drain of the PMOS transistor 64 and the drain of the NMOS transistor 68, at node 57. The drains of the NMOS transistor 74 and 78 are connected together and to the drain of the PMOS transistor 66 and the drain of the NMOS transistor 70, at node 61. The gates of the NMOS transistor 76 and 78 are connected to receive the clock signals A and D, respectively.

The buffer section 80 of the conversion circuit 10 comprises a first clocked stage 81 which comprises a PMOS transistor 82, whose drain is connected in series to a PMOS transistor 84, whose drain is connected in series to an NMOS transistor 86, whose source is connected in series to an NMOS transistor 88. The output O is connected to the gate of the PMOS transistor 82 and the gate of the NMOS transistor 88. The clock signal C is supplied to the gate of the PMOS transistor 84. The clock signal B is supplied to the gate of the NMOS transistor 86.

As previously discussed, the PMOS transistor 82, the PMOS transistor 84, the NMOS transistor 86 and the NMOS transistor 88 are connected in series. The output of the first clock stage 81 is supplied from the junction of the connection of the drain of the PMOS transistor 84 and the drain of the NMOS transistor 86, at node 79, and is supplied to the level sustainer stage, comprised of an inverter stage 83 and a clocked feedback stage 85.

The inverter stage 83 comprises a PMOS transistor 90 and an NMOS transistor 92, connected in series, with the drain of the PMOS transistor connected to the drain of the NMOS transistor 92, to form an invertor. The output from the first clock stage 81 is supplied as an input to the inverter stage 83, by being connected to the gates of the PMOS transistor 90 and the NMOS transistor 92. The output of the inverter stage 83 is supplied from the junction of the drain of the PMOS transistor 90 and the drain of the NMOS transistor 92 and is supplied to the clocked feedback stage 85. In addition, the clocked signals B and C are supplied to the clocked feedback stage 85.

The clocked feedback stage 85 is identical to the first clocked stage 81 in that it comprises a PMOS transistor 94, whose drain is connected in series to a PMOS transistor 96, whose drain is connected in series to an NMOS transistor 98, whose source is connected in series to an NMOS transistor 100. The output of the inverter stage 83 is supplied to the gates of the PMOS transistor 94 and NMOS transistor 100. The clocked signal B is supplied to gate of the PMOS transistor 96. Finally, the clocked signal C is supplied to the gate of the NMOS transistor 98. The output from the clocked feedback stage 85 is formed at the junction of the drain of the PMOS transistor 96 and the drain of the NMOS transistor 98, and forms the output Q of the conversion circuit 10 of the present invention. In addition, the input to the inverter stage 83 is also connected to the output of the clocked feedback stage 85.

Finally, the $\overline{O}$ output of the sense amplifier 50 is supplied to the gate of PMOS transistor 102 and the gate of an NMOS transistor 104. The source and drain of these transistors 102, and 104, are connected together and are supplied to $V_{cc}$ and ground, respectively.

THEORY OF OPERATION

Let us assume that initially the clock signal CLK is low. This is defined as the first Phase or Phase I. The status of the signal from the clock circuit 20 are as follows: clock signal A is high; clock signal B is low; clock signal C is high; clock signal D is low; and clock signal E is high. These clock signals A–E are then supplied to the sense amplifying means 40 and their effect is as follows:

Clock signal A being high turns off PMOS transistor 52. Thus, the sense amplifier 50 is disconnected from $V_{cc}$. In addition, clock signal B being low, turns off the NMOS transistor 54. This again, isolates the sense amplifier 50 from being connected to ground potential. Clock signals C and E being high would turn on the pass transistors 56, 58, 60 and 62 permitting the GTL signal to be present at node 57 and the reference voltage to be present at node 61. With clock signal D being low, the equalizer section 71, comprising of the transistors 72, 74, 76 and 78, is turned off.

During the next phase, or phase II, when the clock signal CLK goes high, the change in state of the clock signal is propagated through the chain of serially connected invertors 22, 24, 26, 28 and 30. Initially, the clock signal CLK going high would cause change only at the output of the first invertor 22. The clock signal A would then go low. With clock signal A going low, this would turn on the PMOS transistor 52 providing power from $V_{cc}$ to node 51.

Through one gate delay (the second invertor 24), the clock signal A going low then causes the clock signal B to high. Clock signal B going high causes the NMOS transistor 54 to be turned on connecting node 53 to ground.

With the PMOS transistor 52 switched to provide the $V_{cc}$ power to the sense amplifier 50 and with the NMOS transistor 54 switched to connect the sense amplifier 50 to ground, a current path is established between $V_{cc}$ and ground. This would cause the sense amplifier 50 to be activated. With $V_{cc}$ supplied to node 51, PMOS transistors 64 and 66 are turned on. Since the GTL input signal supplied at node 57 is at a slightly different voltage level than the reference voltage supplied at node 61, one of the PMOS transistors 64 or 66 would be turned on "harder" than the other. The PMOS transistor 64 and 66 would amplify this slight difference in voltage.

After another gate delay caused by clock signal B passing through the third invertor 26, the clock signal C is generated. The clock signal C would then go low. With clock signal C supplied to pass transistors 62 and 56, the GTL input signal and the reference signal are then blocked from being supplied further to the nodes 57 and 61, respectively. During the time period before clock signal C goes low, a small amount of current is "bled" from nodes 57 and 61 down to the ground potential through transistor 54.

After another gate delay, caused by the clock signal passing through the fourth invertor 28, the clock signal D is produced. Clock signal D is now high. Since clock signal A is still low, the equalizing section 71 continues to be turned off.

Finally, after the clock signal passes through the fifth invertor 30 causing the clock signal E to go low, the pass transistor 60 and 58 are then turn off. This action has no effect in phase I to the sensing process.

During the next phase (or Phase III) when clock signal CLK goes low, the signal is passed through the first invertor 22 causing the clock signal A to go high. With clock signal A going high, it turns on the PMOS transistor 52. In addition, clock signal A going high at the same time that clock signal D continues to be high, clock signals A and D both being high during this small amount of transition time, would cause the equalizer section 71, to be turned on. This causes the nodes 57 and 61 to be equalized, i.e., the same voltage would then be maintained at the nodes 57 and 61.

After passing through the second invertor 24, the clock signal A causes the clock signal B to go low. This would turn off the NMOS transistor 54, isolating the sense amplifier 50. After passing through the third invertor 26, the clock signal C is then turned high, turning on the pass transistors 56 and 62. However, at this point, the GTL signal and the reference signals have not yet been supplied to the nodes 57 and 61. Thereafter, clock signal D goes low, turns off the equalizer section 71. The nodes 57 and 61 are now isolated from one another, but equalized. Finally, when clock signal E goes high, turning on pass transistors 60 and 58, the GTL signal and reference signals are supplied to nodes 57 and 61, respectively.

The output of the sense amplifier 50 are the signals labeled O, from the node 61, and its complement labeled $\overline{O}$, from node 57. These signals along with the clock signals B and C are supplied to the buffer section 80. The output signal O is a CMOS signal ranging from 0 volts to $V_{cc}$. Its complement $\overline{O}$ of course, also ranges from 0 to $V_{cc}$.

During Phase I when the clock signal CLK is low, clock signal A is high turning off the PMOS transistor 52. Clock signal B is low turning off the NMOS transistor 54, thereby turning off the sense amplifier 50. Under this condition, the output signal O is a GTL domain signal. But, the status of the transistors in the first clocked stage 81 is as follows: PMOS transistor 82 is indeterminant. However, PMOS transistor 84 is off, because clock signal C is high. NMOS transistor 86 off, because the clock signal B is low. NMOS transistor 88 is also indeterminant. The output of the first stage 81 at the junction of source/drain of PMOS transistor 84 and NMOS transistor 86 is sustained by bus sustainer (83 and 85), which sustains during tri-state output Q. The condition of the clock in Phase I causes the output Q to be determined by bus sustainer (83 and 85).

During Phase II of the above operation, the clock signal CLK goes high, clock signal A then goes low. Clock signal B would be high and clock signal C would be low. During this phase, the sense amplifier 50 is turned on generating the output O signal at node 61 and the output $\overline{O}$ signal at node 57, depending upon the voltage of the GTL input signal. If the GTL input signal is at a voltage potential higher than REF volts, then PMOS transistor 66 is turn on less than PMOS transistor 64. PMOS transistor 64, being turned on more than PMOS transistor 66 would cause the charges at node 51 to flow through PMOS transistor 64 more bringing the voltage potential at node 57 to yet higher level than the voltage potential at node 61. This would amplify causing the PMOS transistor 66 to be yet further less turned than the PMOS transistor 64 bringing the voltage at node 57 to yet even higher state until $V_{cc}$ is reached.

At the same time, the high voltage at node 57 (compared to the voltage at node 61) causes the NMOS transistor 70 to be turned on harder than the NMOS transistor 68. This would bring down the voltage at node 61 compared to the voltage at node 57. Eventually, the voltage at node 61 would be brought to ground whereas the voltage at node 57 would be brought to $V_{cc}$. This would manifest itself with the output signal O having a ground potential and the output signal $\overline{O}$ at $V_{cc}$. If the GTL input signal is less than 0.8 volts, then the converse would be true, i.e., the output signal O would be at $V_{cc}$ and the output signal $\overline{O}$ would be at ground.

If we assume the GTL input signal is less than 0.8 volts, the output signal O is at $V_{cc}$, then during this phase, the transistors in the output stage 81 would operate as follows: PMOS transistor 82 would be off; PMOS transistor 84 would be on; and NMOS transistor 86 would be on; and NMOS transistor 88 would be on. This causes the node 79 to be at ground.

With ground being the output of first output stage 81, it is supplied to the inverter stage 83. The output of the inverter 83 would be then $V_{cc}$, because the inverter stage 83 is merely an invertor. With $V_{cc}$ as the input to the clocked feedback stage 85, the state in the transistors in the clocked feedback stage 85 are as follows: PMOS transistor 94 is off; PMOS transistor 96 is off; NMOS transistor 98 is off; and NMOS transistor 100 is on.

In Phase III, clock signal B would turn low and clock signal C would turn high. This would turn off PMOS transistor 84 and NMOS transistor 86 in the first output stage 81. The input to the inverter stage 83 still remains at ground, since no switching to the contrary has occurred. This causes the output of the inverter stage 83 to remain at $V_{cc}$. The input to the clocked feedback stage 85 would then cause the transistor therein to operate as follows: PMOS transistor 94 would be off; PMOS transistor 96 would be on; NMOS transistor 98 would be on; and NMOS transistor 100 would be on. This would keep the output Q of the clocked feedback stage 85, i.e., the node at the source/drain junction of the PMOS transistor 96 and NMOS transistor 98 at ground. This would be sent back to the input of the inverter stage 83. Therefore, during this phase, Q would continue to be at ground.

As can be seen from the foregoing, during Phase III, the output of the Q is the same as the output from Phase II, with the output Q from Phase II sustaining its state of the output during Phase III.

Further, the set up time for the conversion circuit 10 of the present invention is almost negligible and the clock to output delay is approximately 1 complex gate. Finally, because the circuit 10 is synchronized to clock, static current is reduced to a minimum, and the circuit is self-timed.

What is claimed is:

1. A synchronous circuit for receiving a GTL signal and for converting said GTL signal to a CMOS level signal comprising:
    sense amplifying means for receiving said GTL signal, a reference signal, and a clock signal and for generating a first signal in response thereto;
    buffer means, having a plurality of clocked stages, for receiving said clock signal and said first signal and for generating said CMOS level signal; and
    means for generating said clock signal and for supplying said clock signal to said sense amplifying means and buffer means.

2. The circuit of claim 1 wherein said buffer means comprises a plurality of odd clocked invertors.

3. The circuit of claim 1 wherein said sense amplifying means comprises:
    differential amplifying means for receiving said GTL signal and for generating said first signal; and
    switch means, activatable in response to said clock signal for connecting said differential amplifying means to a source of power.

4. The circuit of claim 3 wherein said switch means is a PMOS transistor having a gate for receiving said clock signal.

5. The circuit of claim 4 wherein said generating means generates a plurality of clock signals.

6. The circuit of claim 5 wherein said generating means comprises a plurality of invertors, connected in series, each for generating a clock signal.

7. The circuit of claim 6 further comprising:
    a second switch means, activatable in response to one of said plurality of clock signals for connecting said differential amplifying means to ground.

8. The circuit of claim 7 wherein said second switch means is a NMOS transistor having a gate for receiving said one clock signal.

9. A method of converting a GTL signal to a CMOS level signal comprising:
    generating a clocking signal;
    supplying said clocking signal to a switch means interposed between a power source and a sense amplifier means to connect said sense amplifier means to said power source in response to said clocking signal;
    differentially sensing said GTL signal by said sense amplifier means, when activated by said clocking signal, to generate a first signal; and
    buffering said first signal through a plurality of clocked stages.

10. The method of claim 9 wherein said buffering step buffers said first signal through an odd number of clocked stages with the output of the last clocked stage connected to the output of the first clocked stage.

11. The method of claim 9 wherein said generating step generates a plurality of clocking signals.

12. The method of claim 11 wherein one of said plurality of clocking signals is supplied to said switch means.

13. The method of claim 12 wherein said switch means is a PMOS transistor.

14. The method of claim 13 further comprising:
    supplying another of said plurality of clocking signals to a second switch means interposed between said sense amplifier means and a ground to connect said sense amplifier means to said ground.

15. A synchronous circuit for receiving a GTL signal and for converting said GTL signal to a CMOS level signal comprising:
    sense amplifying means for receiving said GTL signal, a reference signal, and a clock signal and for generating a first signal in response thereto;
    buffer means, for receiving said clock signal and said first signal and for generating said CMOS level signal, said buffer means further comprising means for sustaining said CMOS level signal through a change in said clock signal; and
    means for generating said clock signal and for supplying said clock signal to said sense amplifying means and buffer means.

16. The circuit of claim 15 wherein said buffer means comprises a plurality of clocked invertors.

17. The circuit of claim 15 wherein said sense amplifying means comprises:
    differential amplifying means for receiving said GTL signal and for generating said first signal; and
    switch means, activatable in response to said clock signal for connecting said differential amplifying means to a source of power.

18. The circuit of claim 17 wherein said switch means is a PMOS transistor having a gate for receiving said clock signal.

19. The circuit of claim 18 wherein said generating means generates a plurality of clock signals.

20. The circuit of claim 19 wherein said generating means comprises a plurality of invertors, connected in series, each for generating a clock signal.

21. The circuit of claim 20 further comprising:
a second switch means, activatable in response to one of said plurality of clock signals for connecting said differential amplifying means to ground.

22. The circuit of claim 21 wherein said second switch means is a NMOS transistor having a gate for receiving said one clock signal.

* * * * *